United States Patent [19]

Hennessey et al.

[11] 4,023,877
[45] May 17, 1977

[54] MEANS FOR COUPLING A CONNECTOR CABLE TO CONTACTS ON A SUBSTRATE

[75] Inventors: William M. Hennessey, Somerville; Bernard Caras, Princeton; John Steckowich, Jr., Edison; Frederick E. Bratro, Scotch Plains, all of N.J.

[73] Assignee: Burroughs Corporation, Detroit, Mich.

[22] Filed: Oct. 23, 1975

[21] Appl. No.: 624,736

[52] U.S. Cl. ............... 339/17 F; 339/176 MF; 292/87

[51] Int. Cl.[2] ............... H05K 1/12; H01R 13/54

[58] Field of Search ........... 339/17 CF, 17 F, 17 C, 339/39, 75 R, 75 M, 75 MP, 91 R, 76–79, 176 MF, 44; 292/87–89

[56] References Cited

UNITED STATES PATENTS

| | | | |
|---|---|---|---|
| 2,549,725 | 4/1951 | Uline et al. | 339/44 R |
| 3,652,973 | 3/1972 | Doughty | 339/17 F |
| 3,789,345 | 1/1974 | Reimer et al. | 339/75 MP |
| 3,825,878 | 7/1974 | Finger et al. | 339/17 F |
| 3,851,294 | 11/1974 | Palazzetti et al. | 339/17 F |
| 3,905,670 | 9/1975 | Anhalt et al. | 339/75 MP |

FOREIGN PATENTS OR APPLICATIONS 866,052  4/1961  United Kingdom .......... 339/75 MP Primary Examiner—Roy Lake
Assistant Examiner—Neil Abrams
Attorney, Agent, or Firm—Kevin R. Peterson; Robert A. Green

[57] ABSTRACT

The disclosure is of a connector comprising an insulating body which carries a cable having exposed conductors to be pressed into contact with electrode contacts on a substrate. One end of the cable is secured to a printed circuit board or the like. The cable extends over an insert of a synthetic resinous material in the body, which serves to press its conductors into intimate engagement with the conductors on the substrate, and a spring-like clamp, which is coupled to the body, snaps into place and clamps the connector to the substrate, with the cable properly engaging the substrate.

6 Claims, 10 Drawing Figures

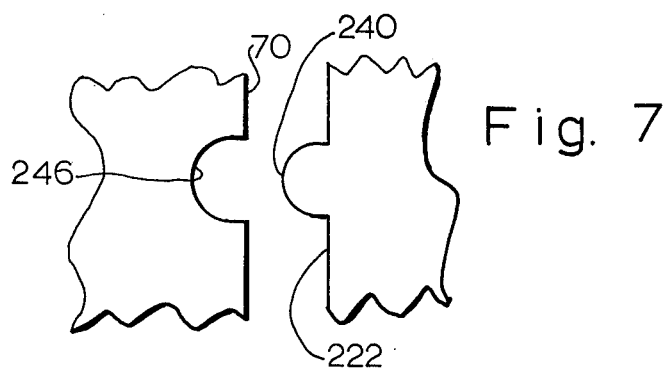
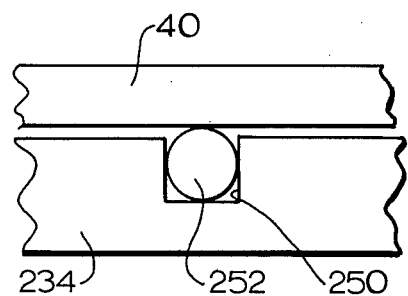
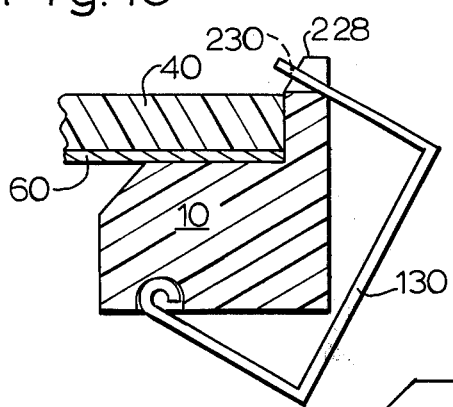
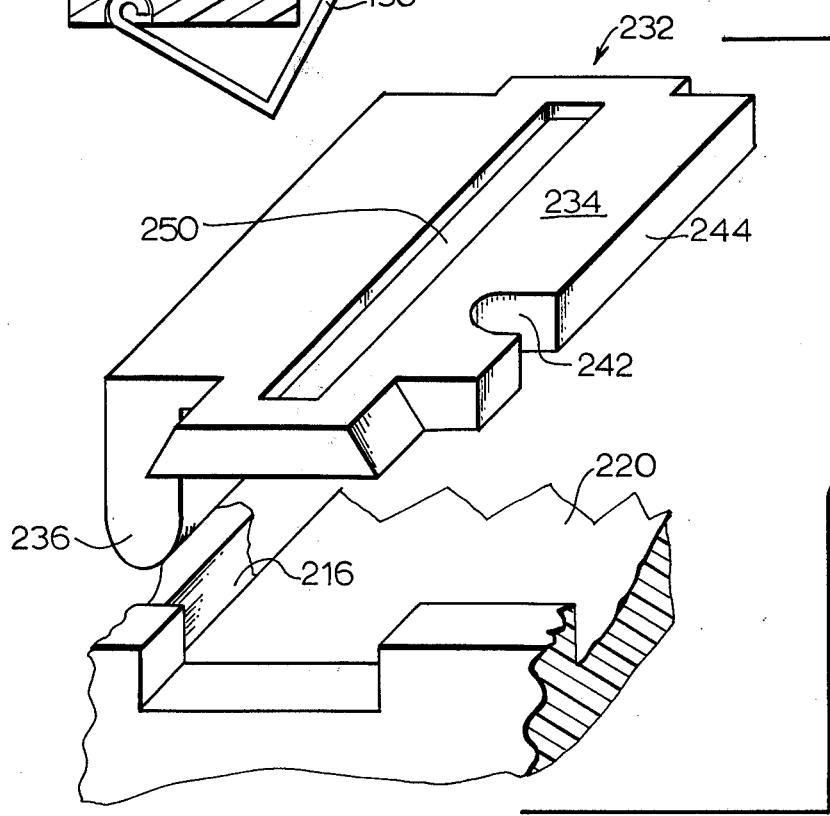

MEANS FOR COUPLING A CONNECTOR CABLE TO CONTACTS ON A SUBSTRATE

BACKGROUND OF THE INVENTION

Display panels of various types have come into wide use in the electronics industry, and, in general, such devices include relatively large numbers of electrodes to which external circuits must be connected. In general, the panel electrodes extend to contact pads at various edges of the panels, and connection is made thereto. A newly developed display panel which is intended to be coupled end-to-end with similar panels has all of its electrodes connected to contact pads on one surface of the panel, along an edge thereof. A relatively large number of closely spaced contacts are provided, and connection of external circuits must be made thereto. No completely suitable connector, for this purpose, is presently available commercially or in the prior art.

SUMMARY OF THE INVENTION

Briefly, a connector embodying the invention comprises a body carrying a leaf spring, by means of which it is adapted to be clamped to an edge of a panel on which contacts are present, to which electrical connection must be made. The body also carries a cable whose conductors are pressed into intimate engagement with the panel contacts.

DESCRIPTION OF THE DRAWINGS

FIG. 7 is a plan view of a portion of the apparatus of the invention;

FIG. 8 is a side elevational view of a portion of the invention;

FIG. 9 is a perspective exploded view, partly in section, of a portion of the apparatus of the invention; and FIG. 10 is a sectional, elevational view of the invention illustrating its operation.

DESCRIPTION OF THE PREFERRED EMBODIMENTS

Figure 1:
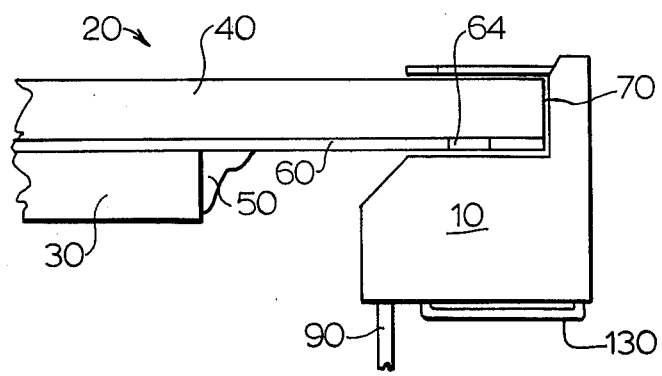
FIG. 1 is a side elevational view of a combination of a display panel and connector embodying the invention.
Figure 2:
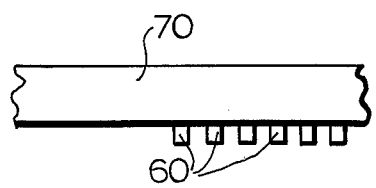
FIG. 2 is a front elevational view of a portion of the panel shown in FIG. 1.
Figure 3:
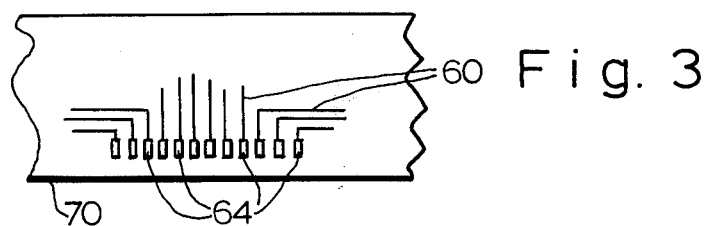
FIG. 3 is a view of the lower surface of the portion of the panel shown in FIG. 2, showing contacts to which electrical connection is to be made.

It will be clear to those skilled in the art that the present invention may be used to couple together two devices, of substantially any type, carrying electrical elements which must make contact with each other. For purposes of illustration, the connector of the invention 10 is described herein as it relates to making electrical connections to a flat display panel 20 which includes a base plate 30 and face plate 40 sealed together by a suitable sealing material 50 (shown in part in FIG. 1) to form a gas-tight envelope. The envelope contains an array of cathode and anode electrodes, not shown, which are connected to conductive runs 60 which extend to contact pads 64 disposed along on edge 70, for example the front edge, of the face plate (FIGS. 2 and 3). A panel of this type is described and claimed in copending application Ser. No. 584,549, filed June 6, 1975.

Figure 4:
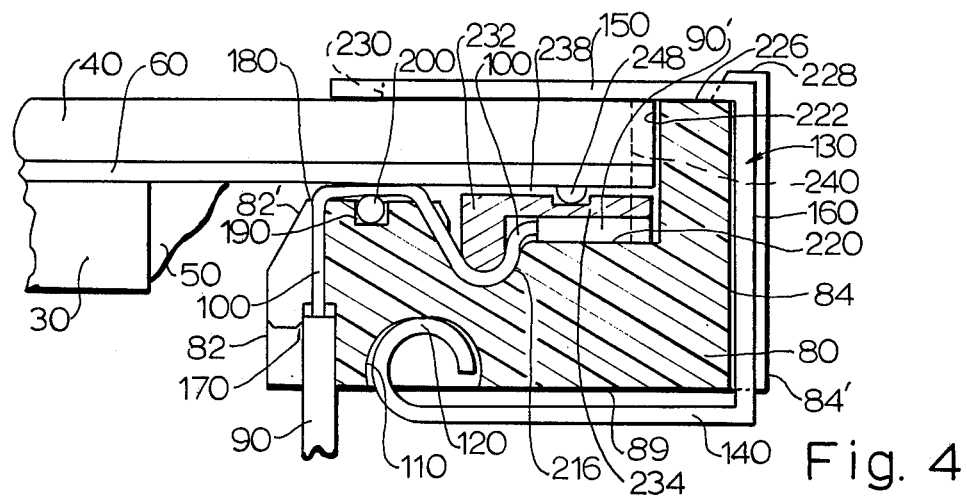
FIG. 4 is an enlarged view, partly in section, of the apparatus of FIG. 1.
Figure 5:
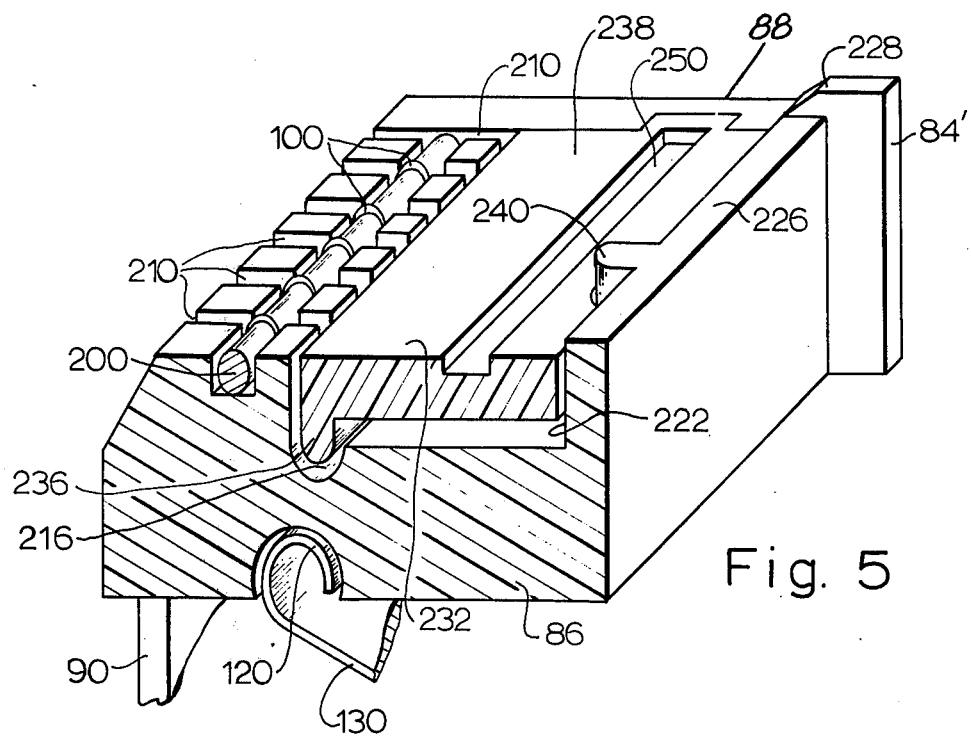
FIG. 5 is a perspective view, partly in section, of a portion of the apparatus shown in FIG. 4.

Referring to FIGS. 4 and 5, the connector 10 includes, as its basic structural element, a body 80 of insulating material having a front wall 82, a rear wall 84, left and right side walls 86 and 88, and a bottom wall 89. The body 80 has a length suitable to accommodate a flat insulated cable 90 having a conductor or wire 100 for each conductive run 60 or contact pads 64 on the face plate 40. The bottomwall 89 of the connector body 80 is provided with a transverse slot or channel 110 which is disposed near the front wall 82 and extends between the side walls 86 and 88 and in which is pivotally disposed the curved end 120 of a leaf spring 130. The leaf spring 130 is generally U-shaped and includes two parallel walls 140 and 150 and a connecting wall 160 between them. The curved end 120 of the spring is at the end of wall 140, which lies parallel to the bottom wall 89 of the body 80. The spring wall 160 lies parallel to the rear wall 84 of the body 80, and wall 150 extends adjacent to and generally parallel to the top surface of the body 80.

The front portion of the body 80, between slot 110 and front wall 82, is provided with a narrow passageway 170 which extends through the thickness of the body from the bottom surface to the top surface and is adapted to receive the cable 90.

The front wall 82 has its upper portion 82' slanted rearwardly to accommodate the panel seal 50 (FIGS. 1 and 4) when the panel and connector are assembled.

Figure 6:
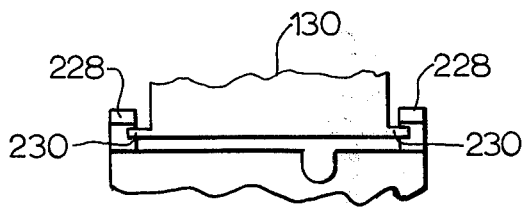
FIG. 6 is a plan view of a portion of the apparatus shown in FIG. 1, illustrating the use of a portion thereof.

The top surface of the body 80 is irregularly shaped and includes a front flat portion 180 having a transverse slot 190 which extends across its width and in which is seated an insulating tube or cylinder 200 of a flexible material such as rubber, Neoprene, or the like. The tube 200 is of such volume that it extends slightly out of slot 190 and above the flat portion 180 of body 80 for a purpose to be described. The front flat portion 180 is also provided with a plurality of longitudinal slots 210 (FIG. 5) which extend transverse of the slot 190 and are adapted to receive the bare wires 100 of the cable 90. Rearwardly of the front flat portion 180, the top surface of the body 80 is provided with a relatively deep transverse recess 216 in which the wires 100 are seated and, adjacent to that, a rear flat portion 220 on which the insulated end 90' of the cable 90 rests. The rear flat portion 220 lies at a lower level than the front flat portion 180 but at a somewhat higher level than the recess 216. The rear flat portion 220 extends rearwardly to a vertical rear wall 222 which extends vertically above surface 180 a distance generally equal to the thickness of the panel face plate 40 and terminates in a top surface 226, which extends between wall 222 and rear wall 84 of body 80 and is generally flat except for two relatively short projections 228 at its ends which are adapted to engage lateral tabs 230 at the free end of the wall 150 of the spring 130 when the spring is rotated clockwise, as seen in FIG. 6, to its open position. The rear wall 84 of body 80 is provided with two vertical projecting ribs 84' along its opposite edges (FIG. 5), which prevent lateral movement of spring 130 when the spring is in locking engagement with body 80, with its wall 160 bearing against wall 84 between ribs 84'.

In using the connector 10, the cable 90, having some of its insulation removed to expose portions of wires 100, is threaded through the passageway 170, and its insulated leading end 90 is seated on the rear flat surface 220. With the cable thus positioned, bare wires 100 are seated on the insulating tube or body 200 in slot 190 and in the slots 210 on either side thereof.

An insulating cable clamping member 232, comprising a generally L-shaped member having a flat, large-area portion 234 and a relatively short depending portion 236, is set in place, with the large-area portion 234 seated on the leading end 90' of cable 90 and the depending portion 236 extending into the recess 216 and pressing the wires 100 into the recess. The top surface 238 of clamping member 232 is preferably coplanar with the front flat portion 180. The clamping member is fixed in place in order to lock the cable in place in the connector, and this is achieved by means of a cement, such as a glass frit, by a heat sealing operation, or in any other suitable manner.

The connector 10 is provided with a keying or guide arrangement including a vertical guide bar 240, having a generally semi-circular cross-section, extending away from the vertical rear wall 222. The guide bar is adapted to enter a generally semi-circular notch 242 formed in the rear edge 244 of the large-area portion 234 of the cable clamp 232. In addition, the leading edge 70 of the panel is provided with a similar notch or indentation 246 (FIG. 7) which mates with the guide bar 240 and thus properly positions the panel and its conductive runs with respect to the connector and its wires 100.

Various other auxiliary features which may be provided in the connector 10 include a keying arrangement made up of an insulating bar or rod 248 secured to the lower surface of the face plate 40 and adapted to seat in a slot 250 formed in the top surface 238 of the large-area portion 234 of the cable clamp member 232.

If this keying arrangement is not employed, another securing means which might be used includes a tube or cylinder 252 of insulating material, like tube 200, provided in slot 250 and performing a generally similar gripping action on the panel face plate when the connector and panel are assembled.

When the connector and panel are coupled together, the parts are positioned so that each of the cable wires 100 contacts a conductor 60 on the panel face plate 40. The front edge 70 of the face plate of the panel is pressed against the vertical rear wall 222, and the lower surface of the face plate seats on surface 180 and on the top surface 238 of the clamping member 232. The insulating body 200 in slot 190 presses the cable conductors 100 firmly against the panel conductors 60 so that good electrical contact is made. With the connector and panel properly positioned with respect to each other, the spring 130 is rotated counter-clockwise, so that it snaps into place in contact with the top surface of the panel face plate, and thus securely clamps together the connector and panel.

There are several advantages to the invention. One advantage arises from the fact that, when the connector and panel are coupled together, the operation is performed with "zero insertion force." As a result, no rubbing or abrasive forces are exerted during assembly of the parts. Another advantage is that the invention permits a spring of minimal thickness (approximately 10 to 15 mils) to be used so that the portion of the spring which rests on the panel face plate does not interfere with the mounting of auxiliary apparatus, such as diffusers and filters, on the face plate.

In addition, as can be seen from the above description, the spring can be readily assembled to the connector body; it is easy to operate to engage and disengage a panel; and, when in the open disengaged position, the spring is easily held in place by portions of the connector body.

What is claimed is:

1. An electrical connector for an electrical component carrying a series of contacts on a substrate, an insulating body having a connector surface adapted to
   support a flat insulated cable having a plurality of conductors, each of which is adapted to contact one of said contacts on said substrate when said cable is positioned on said connector surface and said substrate is seated on said connector surface,
   a flexible support adjacent to said connector surface on which said conductors rest and which serves to press said conductors against said contacts,
   a leaf spring pivotally coupled at one end to said body and adapted to be locked in place on said connector with a portion engaging said substrate and securing together said connector and said substrate, with said conductors in contact with said contacts on said substrate, and
   a pair of walls projecting from said rear surface of said body, between which a portion of said leaf spring is disposed,
   an auxiliary plate seated on said cable to hold it in place, and
   a guide member formed on a portion of said top surface of said body and engaging a portion of said auxiliary plate and a portion of said component to properly position the contacts on said substrate with respect to said conductors.

2. The connector defined in claim 3 wherein said flexible support comprises a body of synthetic resinous material seated in a channel in said connector surface.

3. The connector defined in claim 4 wherein said connector surface is provided with a plurality of slots on either side of said channel and oriented transverse thereto, said conductors being seated in said slots and on said flexible support.

4. An electrical connector for connecting together an insulated multi-conductor cable and an electrical component carrying a series of contacts on a substrate, said connector comprising
   an insulating body having a top surface, a bottom surface, a front surface, and a rear surface,
   a passageway through said body near the front end thereof through which a multi-conductor cable can pass,
   said top surface having a generally planar portion near said rear surface on which one end of said cable is seated, the uninsulated conductors of said cabled being exposed at another portion of said top surface,
   an auxiliary plate seated on said cable to hold it in place,
   a leaf spring pivotally seated at one end in a slot in said bottom surface of said body and adapted to be locked in place on said connector with a portion engaging said component and securing together said connector and said component, with said conductors in contact with said contacts on said substrate, a pair of walls projecting from said rear surface of said body, between which a portion of said leaf spring is disposed, and a guide member formed on a portion of said top surface of said body and engaging a portion of said auxiliary plate and a portion of said component to properly position the contacts on said substrate with respect to said conductors.

5. The apparatus defined in claim 4 wherein said slot in said bottom surface of said body in which said leaf spring is seated is disposed between said passageway and the rear surface of said insulating body.

6. An electrical connector for connecting together an insulated multi-conductor cable and an electrical component carrying a series of contacts on a substrate, said connector comprising:

an insulating body having a top surface, a bottom surface, a front surface, and a rear surface, a passageway through said body near the front end thereof through which multi-conductor cable can pass, said top surface having a generally planar portion near said rear surface on which one end of said cable is seated, the insulated conductors of said cable being exposed at another portion of said top surface, an auxiliary plate seated on said cable to hold it in place, a leaf spring pivotally seated at one end in a slot in said bottom surface of said body and adapted to be locked in place on said connector with a portion engaging said component and securing together said connector and said component, with said conductors in contact with said contacts on said substrate, a pair of walls projecting from said rear surface of said body, between which a portion of said leaf spring is disposed, said projecting walls extending above said top surface of said body to provide two spaced-apart projecting portions, and the free end of said spring having laterally projecting tabs which engage said projecting portions when said leaf spring is pivoted out of engagement with said connector, whereby said leaf spring is held in place and prevented from becoming disengaged from said body, and a guide member formed on a portion of said top surface of said body and engaging a portion of said auxiliary plate and a portion of said component to properly position the contacts on said substrate with respect to said conductors.

* * * * *

UNITED STATES PATENT OFFICE
CERTIFICATE OF CORRECTION

PATENT NO. : 4,023,877

DATED : May 17, 1977

INVENTOR(S) : William M. Hennessey, Bernard Caras, John Steckowich, Jr., and Frederick E. Bratro It is certified that error appears in the above-identified patent and that said Letters Patent are hereby corrected as shown below:

Column 4, Line 38, change "3" to --1--

Column 4, Line 41, change "4" to --1--

Column 5, Line 24, change "insulated" to --uninsulated--

Signed and Sealed this thirtieth Day of August 1977

[SEAL]

Attest:

RUTH C. MASON
*Attesting Officer*

C. MARSHALL DANN
*Commissioner of Patents and Trademarks*